United States Patent [19]

Hutson

[11] 4,007,476
[45] Feb. 8, 1977

[54] TECHNIQUE FOR PASSIVATING SEMICONDUCTOR DEVICES

[76] Inventor: Jearld L. Hutson, P.O. Box 34235, Dallas, Tex. 75234

[22] Filed: Apr. 21, 1975

[21] Appl. No.: 569,704

[52] U.S. Cl. .................................. 357/52; 357/38; 357/64; 357/73
[51] Int. Cl.² ........................................ H01L 29/34
[58] Field of Search .................. 357/38, 39, 52, 73, 357/64

[56] References Cited

UNITED STATES PATENTS

| 3,376,172 | 4/1968 | Byczkowski | 357/38 |
| 3,493,405 | 2/1970 | Thomas | 357/73 |
| 3,632,434 | 1/1972 | Hutson | 357/73 |
| 3,637,425 | 1/1972 | McMillan et al. | 357/73 |

FOREIGN PATENTS OR APPLICATIONS

| 257,282 | 6/1963 | Australia | 357/64 |
| 44-25292 | 10/1969 | Japan | 357/64 |

*Primary Examiner*—Michael J. Lynch
*Assistant Examiner*—Joseph E. Clawson, Jr.
*Attorney, Agent, or Firm*—Richards, Harris and Medlock

[57] ABSTRACT

The specification discloses a technique for passivating a semiconductor device which includes exposing a P-N junction in a multilayered semiconductor body. A mixture of glass and gold is prepared and applied to the exposed P-N junction. A mixture is fired to fuse the glass and gold on the semiconductor body. The carrier lifetime degrading characteristics of the gold reduces the current leakage at the exposed P-N junction. The technique substantially improves the voltage capacity and stability of semiconductor switching devices.

9 Claims, 2 Drawing Figures

TECHNIQUE FOR PASSIVATING SEMICONDUCTOR DEVICES

FIELD OF THE INVENTION

This invention relates to multilayered semiconductor devices, and more particularly relates to a technique for passivating P-N junctions in a semiconductor device.

THE PRIOR ART

It has been heretofore known to fuse glass to exposed P-N junctions of semiconductor devices in order to protect the exposed P-N junctions. An example of such a passivation technique is disclosed and claimed in U.S. Pat. No. 3,632,434 entitled "PROCESS FOR GLASS PASSIVATING SILICON SEMICONDUCTOR JUNCTIONS" and issued to applicant on Jan. 4, 1972. However, such prior passivating techniques have not been completely successful in minimizing leakage currents at the exposed P-N junctions, and a need has thus arisen for a technique for improving the voltage capacity and stability at exposed P-N junctions in semiconductor devices such as diodes and the like.

SUMMARY OF THE INVENTION

In accordance with the present invention, a technique is provided which enables the fabrication of a semiconductor device including a body of semiconductor material having layers of opposite semiconductor conductivity type which form at least one P-N junction. A region of glass doped with a carrier lifetime degrading material is formed in contact with the P-N junction, wherein the voltage capacity and stability of the P-N junction is substantially enhanced.

In accordance with a more specific aspect of the invention, a semiconductor device is formed which includes a semiconductor body having a plurality of layers of opposite conductivity types to form at least one P-N junction. A portion of the body is removed to expose the P-N junction and electrodes are formed on the body. Gold-doped glass is formed within the removed portion of the body in contact with the exposed P-N junction. The resulting device has a substantially improved voltage capacity and stability due to the carrier lifetime degradation properties of the gold-doped glass.

In accordance with another aspect of the invention, a semiconductor device is passivated by exposing a P-N junction in a multilayered semiconductor body. A mixture of glass and gold is formed and applied to the exposed P-N junction. The mixture is fired to fuse the glass and gold on the semiconductor body in order to passivate the P-N junction, while substantially improving the voltage capacity and stability of the P-N junction.

DESCRIPTION OF THE DRAWINGS

For a more complete understanding of the present invention and for further objects and advantages thereof, reference is now made to the following description, taken in conjunction with the accompanying drawings, in which.

DESCRIPTION OF THE PREFERRED EMBODIMENT

Figure 1:
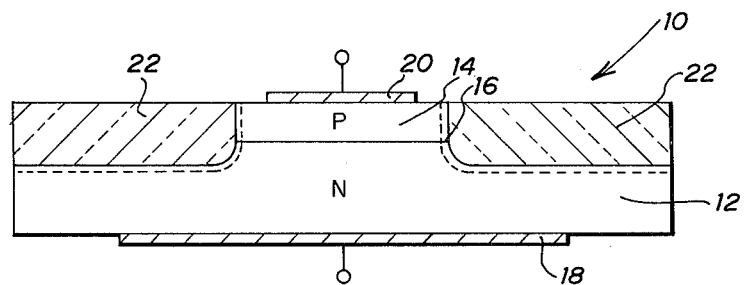
FIG. 1 is a somewhat diagrammatic sectional view of a P-N diode formed in conjunction with the present invention.

Referring to FIG. 1, a P-N diode is illustrated generally by the numeral 10. While the present technique is described in conjunction with the P-N diode 10, it will be understood that the present technique is applicable to a variety of different types of semiconductor devices, and particularly to semiconductor switches such as various types of diodes, SCR's, transistors and the like.

Diode 10 comprises a layer 12 of N-type semiconductor conductivity material. A layer 14 of P-type conductivity material is formed adjacent layer 12 to form the P-N junction 16 in the conventional manner. Portions of layers 12 and 14 are removed to provide the well-known island configuration, wherein the P-type layer 14 has a smaller diameter than the diameter of N-type layer 12. An electrode 18 is formed in contact with the layer 12, while an electrode 20 is formed in contact with the P-type layer 14. Electrodes 18 and 20 thus provide a two terminal P-N high voltage diode.

The P-N junction 16 is exposed at the periphery thereof. In order to prevent degradation of the exposed P-N layer, it has heretofore been known to apply passivating glass thereto. An important aspect of the present invention is the provision of improved passivating material 22 within the recessed portion of the diode 10 in order to protect the exposed P-N junctions 16. The improved passivating material according to the present invention comprises glass, in combination with material having carrier lifetime degradation properties. These properties further protect the exposed P-N junction from leakage currents, and substantially enhance the voltage capacity and stability of the junction.

While a plurality of carrier lifetime degrading materials are known, in the preferred embodiment of the invention, gold is utilized. The gold may be intermixed with the glass prior to original construction of the glass or subsequent to fabrication of the glass. Gold is intermixed with the glass in a suitable manner, and is evenly distributed throughout the glass. Further, the gold is slightly diffused into the semiconductor device. However, the greatest concentration of gold in the silicon is in the region of the exposed P-N junction. The ability of carriers to move in the vicinity of the exposed P-N junction is thus reduced, thus reducing leakage currents.

Figure 2:
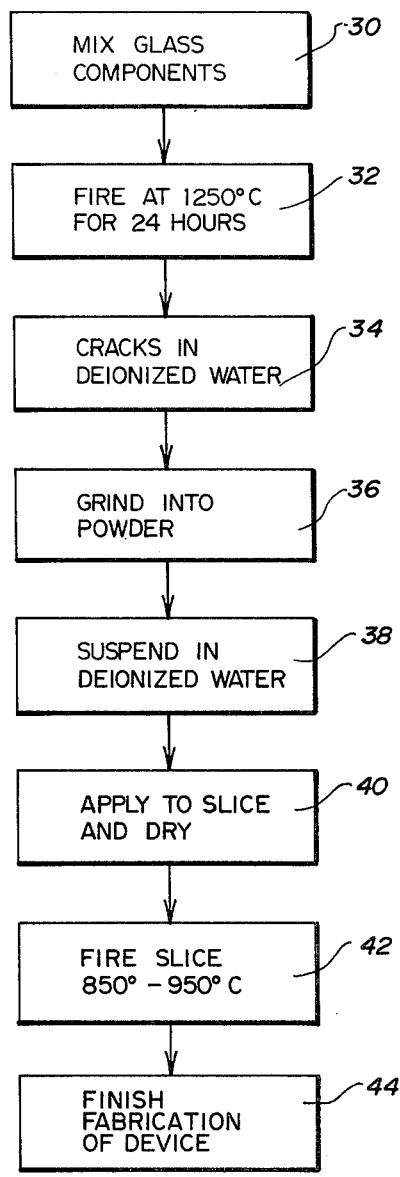
FIG. 2 illustrates the steps of forming the passivation structure in accordance with the invention.

FIG. 2 illustrates a series of steps for applying the preferred gold-doped glass to the device shown in FIG. 1. The device shown in FIG. 1 is initially fabricated with the N-type layer 12 and the P-type layer 14, and is etched to form the illustrated island configuration. Glass components are then mixed at step 30. While it will be understood that the components of the glass may be varied in accordance with desired operating characteristics, a suitable glass may comprise the following:

about 40% to about 60% lead oxide
from 0 to 20% aluminum oxide
from about 0.001% to several percent of gold oxide
about 30% to about 50% silicon dioxide This mixture of components is then fired at 1250° C. for approximately 24 hours at step 32. The resulting glass is poured into deionized water at 34 in order to crack the formed glass. The cracked glass is then ground into powder at step 36. The resulting glass and gold powder is suspended in deionized water at step 38. The suspended water is applied to the slice or to the device shown in FIG. 1 and dried at step 40. The slice or device is then fired at step 42 at a temperature of approximately 850° to 950°. The device is finally fabricated by the addition of electrodes 18 and 20 and by suitable packaging operations.

The device formed in accordance with steps shown in FIG. 2 results in gold-doped glass wherein the gold has a concentration of from $10^{16}$ to $10^{23}$ atoms per cubic centimeter. The maximum concentration of the gold is at the interface of the P-N junction, and the gold diffuses slightly into the semiconductor body. As previously noted, the gold-doped glass thus prepared substantially reduces leakage currents at the exposed P-N junctions and substantially enhances the voltage capacity and stability of the junction. The present technique may be utilized on a plurality of different types of multilayer semiconductor switches such as SCR, emitter gate devices, transistors, and the like.

In place of the lead oxide described with respect to FIG. 2, zinc oxide together with boron oxide may be utilized instead of lead oxide. In addition, other carrier lifetime degrading materials such as platinum may be utilized in place of gold.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. In a semiconductor device, the combination comprising:
    a body of semiconductor material having layers of opposite semiconductor conductivity type forming at least one P-N junction,
    a region of glass doped with carrier lifetime degrading material selected from gold and platinum contacting said P-N junction, wherein the voltage capacity and stability of said P-N junction is enhanced.

2. The combination of claim 1 wherein said glass includes at least 40% of lead oxide.

3. The combination of claim 1 wherein said glass includes at least 40% of zinc oxide.

4. A semiconductor device comprising:
    a semiconductor body including a plurality of layers of opposite conductivity types to form at least one P-N junction,
    a portion of said body being removed to expose said P-N junction,
    electrodes formed on said body,
    glass doped with material selected from a group comprising gold and platinum formed within said removed portion of said body in contact with said exposed P-N junction, wherein the voltage capacity and stability of said device is enhanced by the carrier lifetime degradation properties of said doped glass.

5. The semiconductor device of claim 4 wherein the maximum concentration of said gold or platinum is in the region of said P-N junction.

6. The semiconductor device of claim 4 wherein the concentration of gold or platinum within said glass ranges from $10^{16}$ to $10^{23}$ atoms per cubic centimeter.

7. The semiconductor device of claim 4 wherein said gold doped glass comprises:
    about 40% to about 60% lead oxide;
    about 30% to about 50% silicon dioxide,
    up to about 20% aluminum oxide, and
    at least about 0.001% gold oxide.

8. The semiconductor device of claim 4 wherein said glass includes lead oxide.

9. The semiconductor device of claim 4 wherein said glass includes zinc oxide.

* * * * *